United States Patent [19]

Liebman et al.

[11] Patent Number: 5,453,581
[45] Date of Patent: Sep. 26, 1995

[54] PAD ARRANGEMENT FOR SURFACE MOUNT COMPONENTS

[75] Inventors: Henry F. Liebman, Tamarac; Peter E. Albertson, Cooper City, both of Fla.

[73] Assignee: Motorola, Inc., Schaumburg, Ill.

[21] Appl. No.: 112,928

[22] Filed: Aug. 30, 1993

[51] Int. Cl.$^6$ ..................................... H05K 1/02
[52] U.S. Cl. ..................... 174/261; 361/767; 361/768; 361/808
[58] Field of Search ..................... 174/261, 259; 361/767, 768, 808; 439/71, 83; 228/180.1, 180.2; 29/832, 834, 840

[56] References Cited

U.S. PATENT DOCUMENTS

| | | | |
|---|---|---|---|
| 4,551,788 | 11/1985 | Daniel et al. | 361/403 |
| 4,558,812 | 12/1985 | Bailey et al. | 228/180.1 |
| 4,835,345 | 5/1989 | Haarde | 174/68.5 |
| 4,870,225 | 9/1989 | Anao et al. | 174/68.5 |
| 4,878,611 | 11/1989 | LoVasco et al. | 228/180.2 |
| 5,011,066 | 4/1991 | Thompson | 228/180.2 |
| 5,303,122 | 4/1994 | Adams, Jr. et al. | 361/767 |

*Primary Examiner*—Leo P. Picard
*Assistant Examiner*—L. Thomas
*Attorney, Agent, or Firm*—Robert S. Babayi; Pedro P. Hernandez

[57] ABSTRACT

A pad arrangement (100) for aligning and attaching a surface mount component (402) with other circuitry includes a substrate (102) upon which opposing pads (108) are attached. Each of the pads occupies a substantially rectangular area (110) having four sides. In order to facilitate alignment of the surface mount component the substantially rectangular area has two opposing flat sides an outwardly extending arcuate area (112) along at least one of the other two sides.

14 Claims, 4 Drawing Sheets

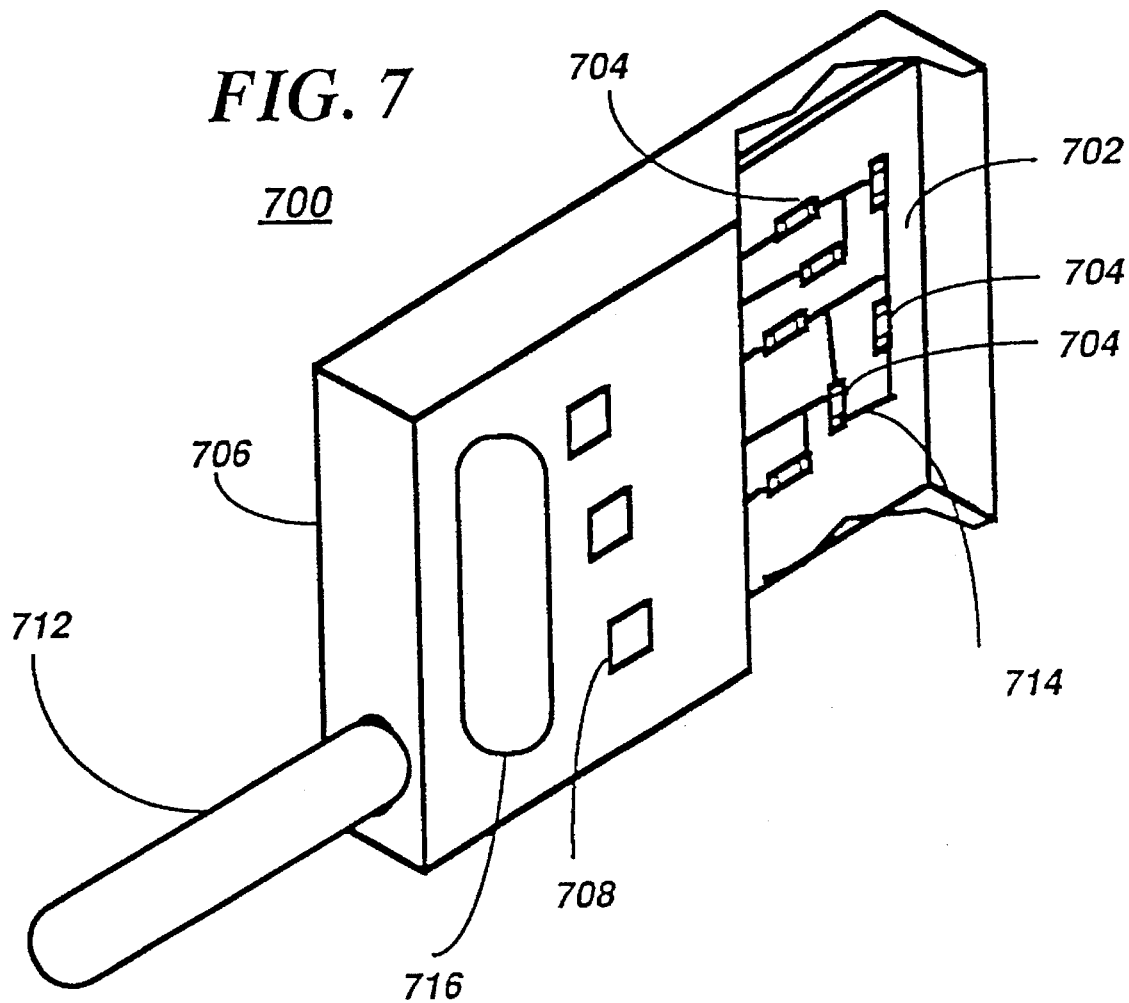

PAD ARRANGEMENT FOR SURFACE MOUNT COMPONENTS

TECHNICAL FIELD

This invention relates in general to pad arrangement for circuit boards, and more specifically to a pad arrangement for attaching surface mount components to a substrate.

BACKGROUND

There are many well-known methods of mounting electronic components to a substrate. One method is the conventional "reflow soldering" process used for attaching terminations of surface mount components. In the conventional reflow soldering process the terminations of the surface mount components have a thin pre-tin solder coating and are attached during a manufacturing process to rectangular mounting pads etched onto a substrate. The process comprises printing a solder paste through a stencil having apertures matching the size and location of the mounting pads, placing the surface mount component terminations on top of the solder paste in alignment with the mounting pads therefor, and passing the substrate and surface mount components through a reflow solder oven for heating the pre-tin solder coating and solder paste to a liquefied state to attach the terminations to the mounting pads.

Another conventional method for mounting a device on a substrate is known as clad or solid solder deposition (SSD), a process which effectively eliminates the solder paste screening process described above. In this process, a specific amount of pre-applied and solidified solder is deposited on the pads prior to component placement. During component attachment, a predetermined amount of tacky solder flux is deposited on the clad portion. Later, the surface mount component is placed on the clad and the pre-applied solder is reflown to attach the component to the substrate.

Disadvantageously, during the conventional reflow soldering and SSD processes termination attachment defects occur because the terminations of the surface mount components do not always remain aligned with the mounting pads. Errors in initial placement of the surface mount components, vibrations from equipment used to move the substrate through a manufacturing area, thermal gradient, and general handling also can cause misalignment.

Unfortunately, the rectangular mounting pad geometry used in the conventional process are only partially effective in correcting any misalignment that occurs. Other pad geometries, such as circular, oval and/or, tri-oval have also been used to correct the misalignment problem.

However, the trend of electronic devices towards smaller sizes requiring micro-miniature components tends to increase defect rates even further in the conventional reflow soldering process. This is because the defect rate due to misalignment increases as the terminations, mounting pads, and alignment tolerances become smaller.

Thus, what is needed is a better way of mounting surface mount components to corresponding mounting pads on a substrate. A pad arrangement that can minimize resulting component misalignment and reduce attachment defects on microminiature components is highly desired.

SUMMARY OF THE INVENTION

Briefly, according to the invention, there is provided a pad arrangement for aligning and attaching a leadless surface mount component having a length with opposing ends and a termination at each end. The pad arrangement is for interconnecting the surface mount component with other circuitry. The pad arrangement comprises a substrate for supporting and interconnecting the surface mount component with the other circuitry, and at least one pad formed on the substrate and interconnected with the other circuitry. The pad occupies a substantially rectangular area having four sides. The substantially rectangular area has two opposing flat sides extending along the length of the surface mount component when the terminations are aligned with the pad arrangement and an outwardly extending arcuate area along at least one of the other two opposing sides. The pad arrangement further comprises a conductive material applied to the substantially rectangular area and thereafter reflowed on to the outwardly extending arcuate area to facilitate alignment of the component with the pad arrangement.

BRIEF DESCRIPTION OF THE DRAWINGS

FIG. 7 is an isometric view of a radio which uses a circuit board utilizing the pad arrangement in accordance with the preferred embodiment of the present invention.

DETAILED DESCRIPTION OF THE PREFERRED EMBODIMENT

Figure 1:
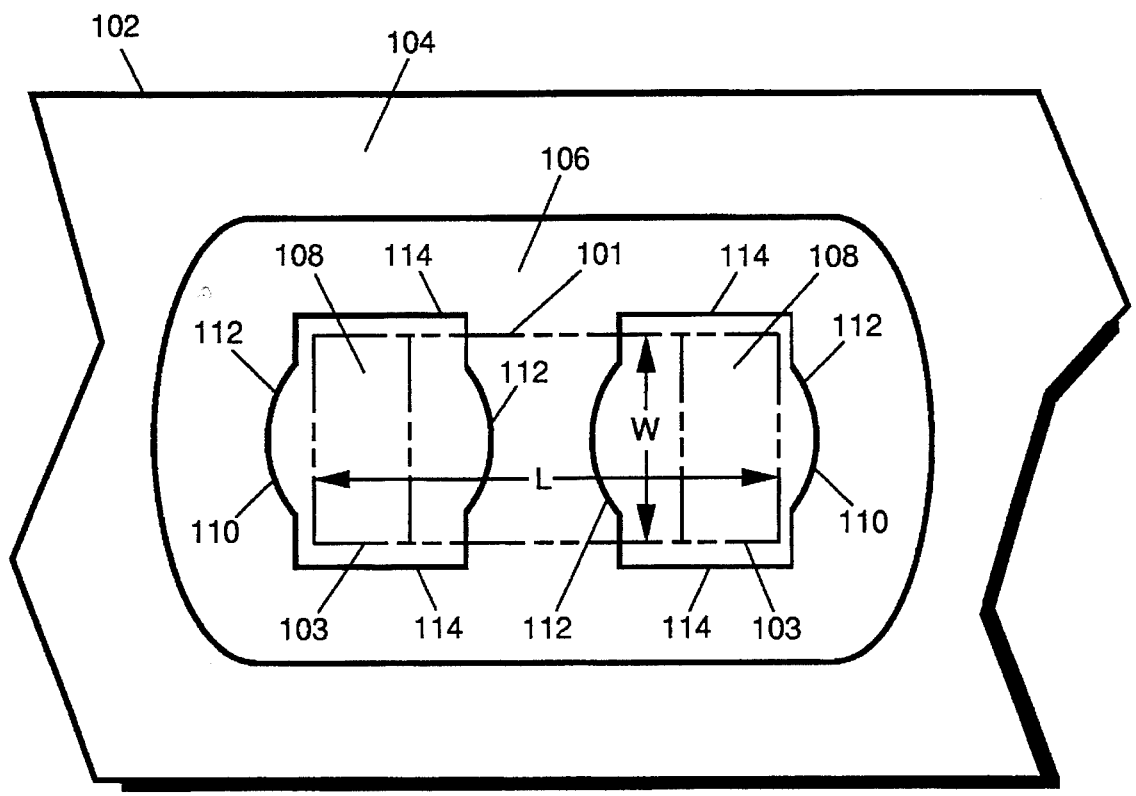
FIG. 1 is a top orthographic view of a pad arrangement in accordance with the preferred embodiment of the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a top orthographic view depicts a pad arrangement 100 in accordance with the preferred embodiment of the present invention comprising a substrate 102 having formed thereon two opposite pads 108 each occupying a substantially rectangular area 110. The pads 108 are separated from each other to accommodate interconnection of surface mount components of varying size to each other and other circuitry. One such surface mount component 101 is shown with the dotted line as positioned on the pads 108 in an orientation substantially aligned with the pad arrangement 100. The surface mount component 101 is shown to have a length L and a width W. The surface mount component 101 has opposing ends along its length (pointed to by arrows) with terminations 103 at these ends. The substrate 102 has a protective coating 104 (solder resist), which has been removed from the pads 108 to allow further processing of the pads 108. The protective coating 104 is also removed from between the pads 108 and from a pad surround area 106 to allow free movement of the surface mount component 101 for realignment during reflow soldering, as will be described herein below. According to the invention, each substantially rectangular pad 108 has four sides. The substantially rectangular area 110 has two opposing flat sides 114 which extend along the length of the surface mount component 101 when the terminations 103 are aligned with the pad arrangement 108. The substantially rectangular area 110 also has outwardly extending arcuate areas 112 which are situated along at least one of the other two opposing sides and extend substantially parallel along the width W of the aligned surface mount component 101. As shown, the opposing pads 108 are positioned on the substrate 102 such that the outwardly extending arcuate areas 112 of each of the two pads 108 are positioned substantially in front of each other. Additionally, as shown the substantially rectangular areas 110 are sized to extend beyond the terminations 103 of the surface mount component 101 when the surface mount component 101 is aligned with the pad arrangement 100. As such the substantially rectangular areas 110 occupy a larger area than that covered by the terminations 103 of the component 101. As described later in detail, the arcuate areas 112 along at least one of the four sides and the large sizing of the substantially rectangular areas 110 facilitate alignment of a surface mount component during reflow soldering.

Preferably, the substrate 102 comprises a glass filled epoxy material, such as FR4 filled epoxy, and the protective coating 104 comprises a thermally cured wet-film resist, such as Probimer™, manufactured by Ciba-Geigy Corporation of Terry Town, N.Y. Preferably, the substantially rectangular shaped pads 108 are formed of copper coated with a tin-lead alloy. It will be appreciated that similar alternative materials may be utilized for the substrate 102, the protective coating 104, and the pads 108.

Figure 2:
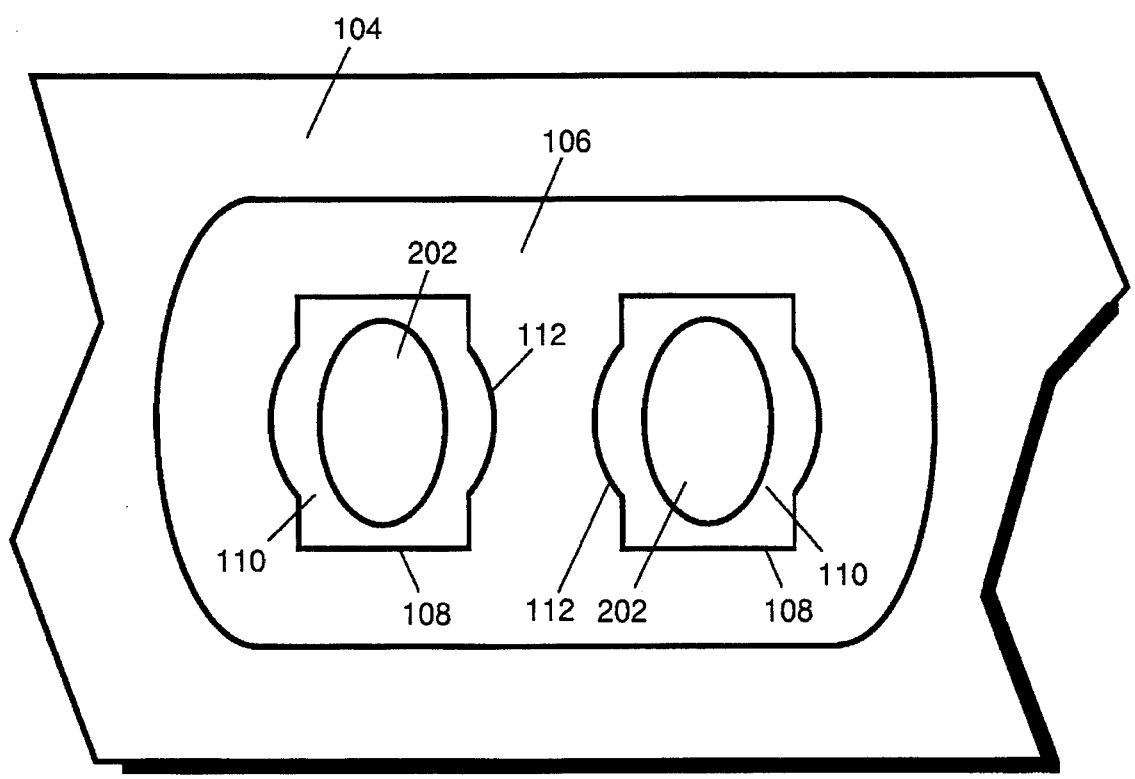
FIG. 2 is a top orthographic view of the pad arrangement after solder paste is applied in accordance with the preferred embodiment of the present invention.

Referring to FIG. 2, a top orthographic view depicts the pad arrangement 100 after a solder paste 202 is applied using a stencil or dispense needle to limit the solder paste 202 to only to the substantially rectangular areas 110 of the pads 108 in accordance with the preferred embodiment of the present invention. The solder paste 202 is applied evenly, such that the centroids of the solder pastes 202 are substantially centered with the substantially rectangular areas 110 after the application. Preferably, the solder paste 202 is a fine pitch solder paste, such as Kester 247B, manufactured by Kester Solder Division, Litton Systems, Inc., of Des Plaines, Ill., applied to the substantially rectangular areas 110 by printing through an six-rail (0.15 mm) stainless steel stencil (not shown) having openings corresponding to the substantially rectangular areas 110. It will be appreciated that other materials may be used for the solder paste 202 and the stencil, and that other thicknesses of stencil also may be used, depending upon the component size and component termination size, and the pad sizes.

Figure 3:
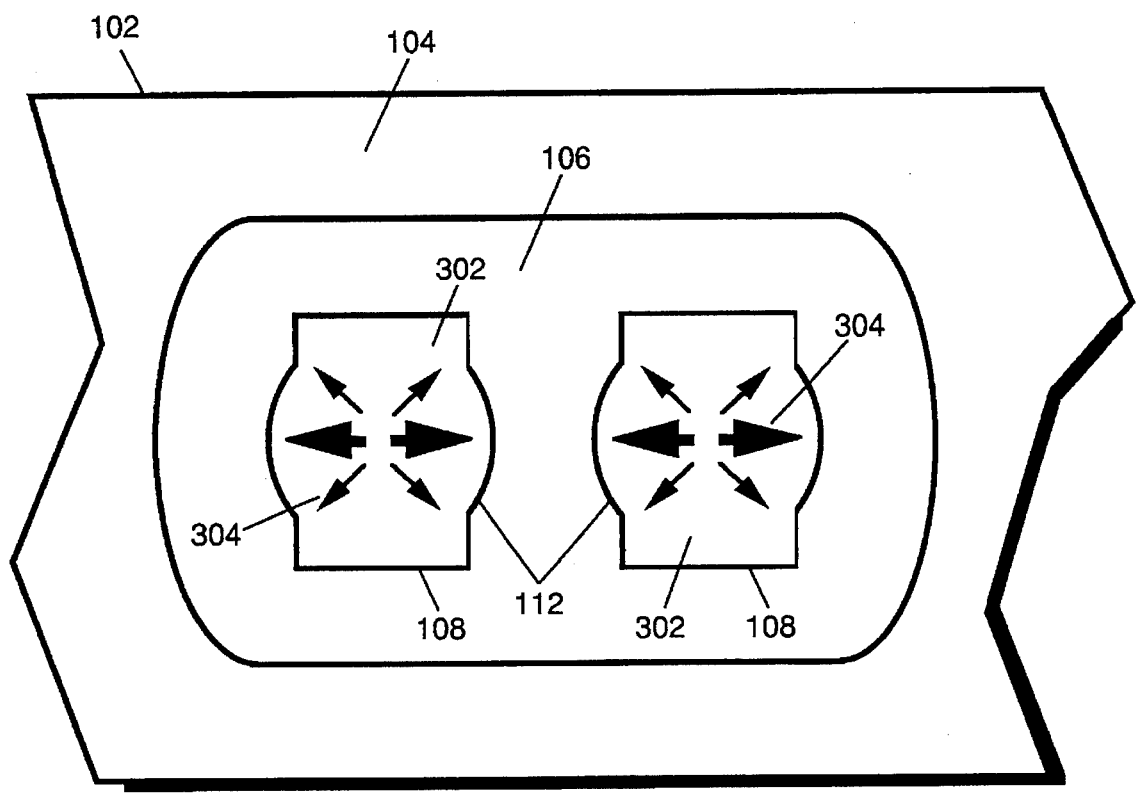
FIG. 3 is a top orthographic view of the pad arrangement after reflow soldering in accordance with the preferred embodiment of the present invention.

Referring to FIG. 3, a top orthographic view depicts the pad arrangement 100 after reflow soldering in accordance with the preferred embodiment of the present invention. In this view, solder 302 in the solder paste 202 has liquefied and has flowed onto the arcuate areas 112, moving in the direction of the arrows 304 on each of the pads 108, to a position substantially over the arcuate areas 112. It will be appreciated that at this point that alternative reflow processes, such as solid solder deposition can be applied. The solid solder deposition reflow process utilizes solid solder, predeposited onto the pads 108, flux deposited on each reflowable joint on the substrate 102, with subsequent surface mount component attachment during reflow. As will be explained herein below in accordance with the preferred reflow process, the movement of the solder 302 onto the arcuate areas 112 is beneficial to the alignment of a surface mount component 402 (FIG. 4) being attached to the pad arrangement 100 during the reflow soldering process.

Figure 4:
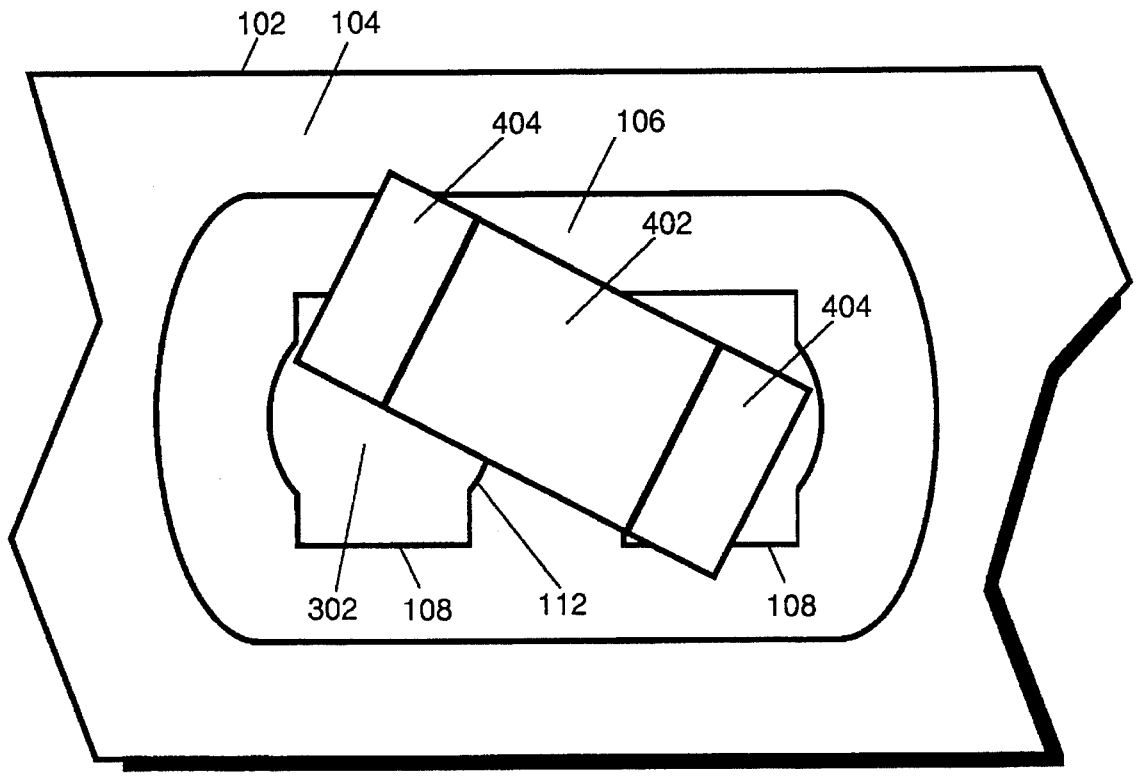
FIG. 4 is a top orthographic view of the pad arrangement and a surface mount component before reflow soldering in accordance with the preferred embodiment of the present invention.
Figure 5:
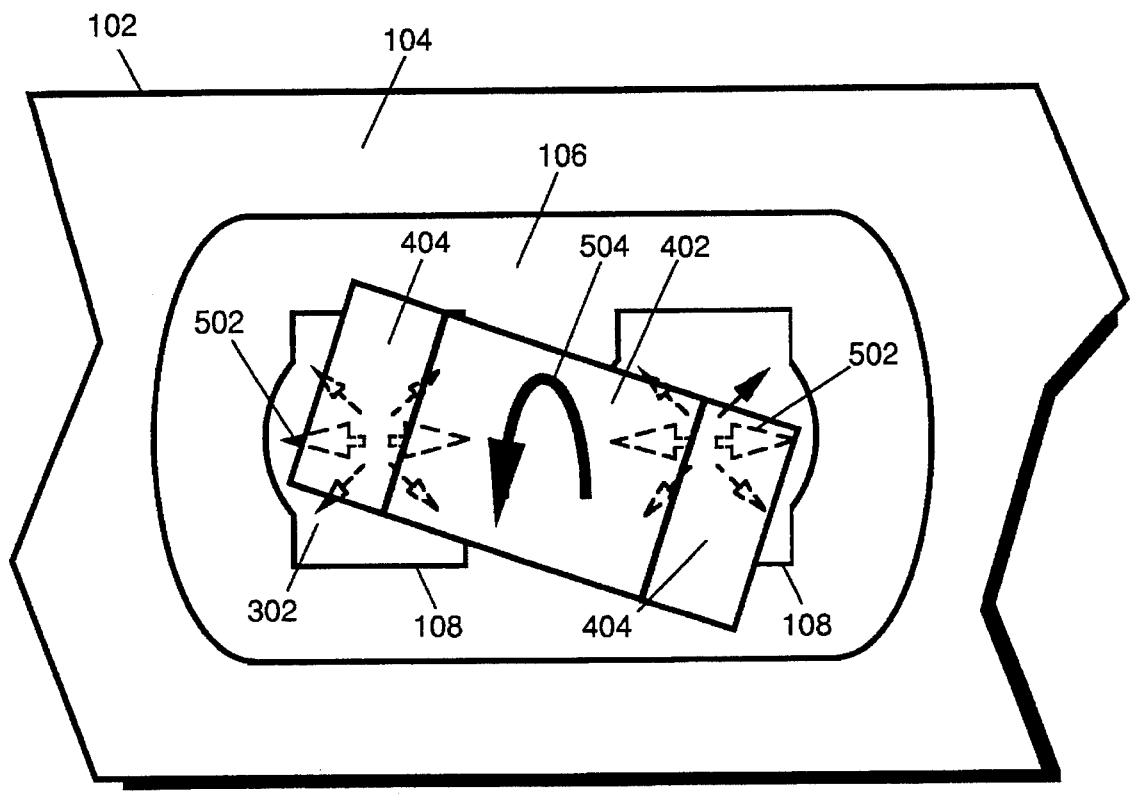
FIG. 5 is a top orthographic view of the pad arrangement and the surface mount component during reflow soldering in accordance with the preferred embodiment of the present invention.
Figure 6:
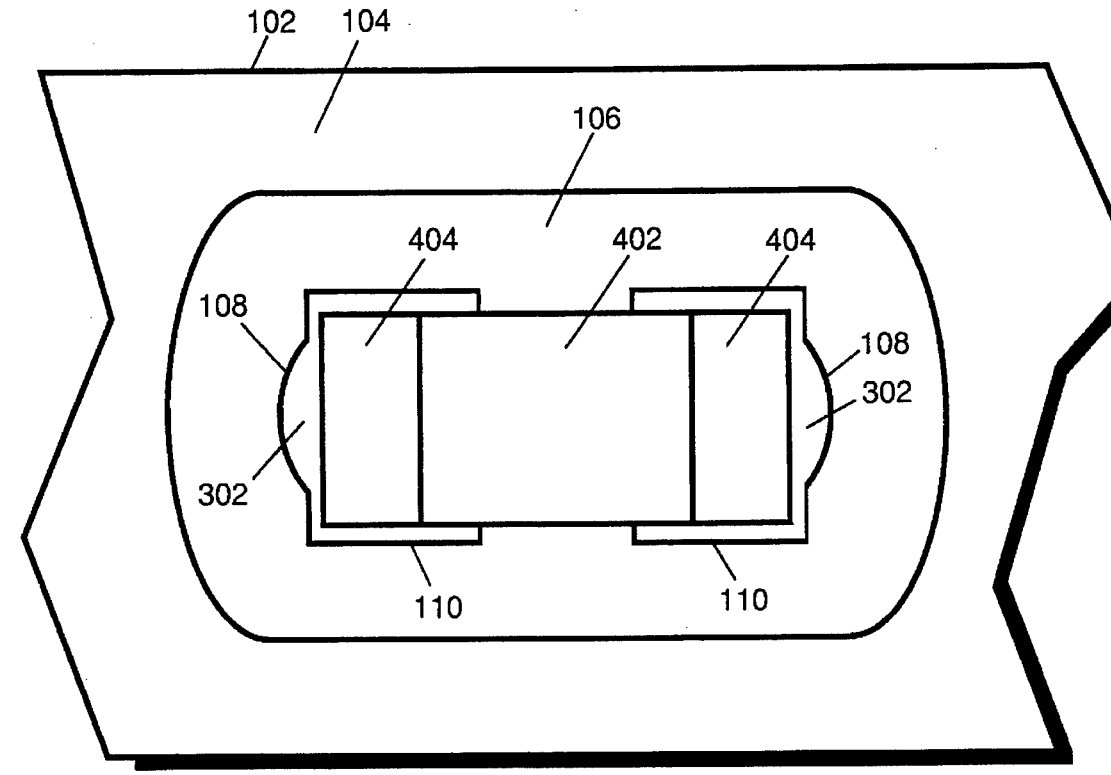
FIG. 6 is a top orthographic view of the pad arrangement and the surface mount component after reflow soldering in accordance with the preferred embodiment of the present invention.

Referring to FIGS. 4, 5 and 6, top orthographic views depict the pad arrangement 100 and the surface mount component 402 before, during, and after reflow soldering, respectively, in accordance with the preferred embodiment of the present invention. In FIG. 4, terminations 404 of the surface mount component 402 are depicted as grossly misaligned with respect to the two pads 108 of the pad arrangement 100. In FIG. 5, during the reflow soldering process, the solder 302 is liquefied by heat, and flows onto the terminations 404 and onto the arcuate area 112, thereby generating movement toward the outwardly extending arcuate area 112 and increasing surface tension forces 502. The increase in the surface tension forces 502 tend to rotate the surface mount component 402 in the direction indicated by the curved arrow 504. In FIG. 6, after the reflow soldering process, the surface mount component 402 has been pulled into alignment with the pad arrangement 100 by the surface tension forces 502 and movement of the solder 302 when the solder 302 was liquefied and resolidified during the reflow solder process. As shown, when the surface mount component 402 is aligned with the pads 108, the substantially rectangular areas 110 and the solder 302 extend beyond the terminations 402.

Referring to FIG. 7, an isometric view of a portable two-way radio 700 which includes a receiver and a transmitter for communicating information is shown. The radio 700 includes a circuit board 702 which incorporates at least some of the circuitry necessary for operation of the radio 700. The circuit board 702 is constructed according to the preferred embodiment of the present invention and comprises a substrate for supporting and interconnecting surface mount components with other circuitry. As such, attached to the circuit board 702 are surface mount components 704 which are interconnected to each other and other circuitry via runners 714. The surface mount components are attached to substantially rectangular opposite pads on the circuit board 702 similar to the pads 108 in accordance with the preferred embodiment of the present invention. The radio 700 further comprises a housing 706 for protecting circuitry contained therein, user controls 708 for control of the operation of the radio 700, a display 716 for visual user interface, and an antenna 712 for receiving and transmitting communicated signals. The theory of operation and use of the portable two-way radio 700 including that of the transmitter and the receiver incorporated therein is well known. An exemplary two-way radio which may utilize the circuit board and pad arrangement of the present invention is a MT1000® radio manufactured by Motorola Inc.

As described above, the surface mount component misalignment problem is corrected by the novel geometry of the pad arrangement of the present invention. The outwardly extending arcuate areas 112 along the sides of the substantially rectangular area 110 in conjunction with its size which extends beyond the termination of the surface mount component tend to move the increased surface tension forces during reflow process in a direction which advantageously forces alignment of the surface mount component.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A pad arrangement for aligning and attaching a leadless surface mount component with other circuitry, the surface mount component having a length with opposing ends and a termination at each end, the pad arrangement comprising:

a substrate for supporting and interconnecting the surface mount component with the other circuitry; and a pad arrangement including at least two opposite pads formed on the substrate and separated from each other to accommodate attachment and alignment of the terminations of said surface mount component to said substrate, each of said at least two pads having two sets of opposing sides wherein one set of opposing sides is parallel and flat and the other set comprises parallel and flat sections connected to the one set and outwardly extending arcuate areas extending between the parallel and flat sections.

2. The pad arrangment of claim 1, wherein said said at least two opposite pads are sized to extend beyond the terminations of the surface mount component when the surface mount component is aligned with the pad arrangement.

3. The pad arrangement of claim 1, wherein said at least two opposite pads are positioned on said circuit board such that the one of the arcuate areas on each of the at least two pads are positioned substantially in front of each other.

4. The pad arrangement of claim 1, further including a conductive material applied to at least a portion of each of the at least two pads and thereafter reflowed onto the arcuate areas of each of the pads, thereby facilitating alignment of the component with the pad arrangement.

5. The pad arrangement of claim 4, wherein the conductive material comprises solid solder deposition.

6. The pad arrangement of claim 4, wherein the conductive material comprises solder paste.

7. A circuit board for interconnecting at least one surface mount component to other circuitry, the surface mount component having a length with opposing ends and a termination at each end, the circuit board comprising:

a substrate for supporting and interconnecting the surface mount component with the other circuitry;

a pad arrangement including two opposite pads formed on the substrate and separated to accommodate attachment of the terminations of said surface mount component to said substrate, each of said two pads having two sets of opposing sides wherein one set of opposing sides is parallel and flat and the other set comprises parallel and flat sections connected to the one set and outwardly extending arcuate areas extending between the parallel and flat sections; and a conductive material applied to at least a portion of each of the two opposite pads and thereafter reflowed onto the outwardly extending arcuate areas, thereby facilitating alignment of the component with the pad arrangement.

8. The circuit board of claim 7, wherein said two pads are sized to extend beyond the terminations of the surface mount component when the surface mount component is aligned with the pad arrangement.

9. The circuit board of claim 8, wherein said opposite two pads are positioned on said substrate such that the outwardly extending arcuate areas of each of the two pads are positioned substantially in front of each other.

10. The circuit board of claim 4, wherein the conductive material comprises solid solder deposition.

11. A radio for communicating information, the radio having circuitry disposed on a circuit board, comprising:

at the circuit board:

at least one surface mount component having a length with opposing ends and a termination at each end, said circuit board interconnecting the surface mount component to the circuitry;

a pad arrangement two opposite pads formed on the circuit board and separated to accommodate attachment of the terminations of said surface mount component to said circuit board, each of said two pads having two sets of opposing sides wherein one set of opposing sides is parallel and flat and the other set comprises parallel and flat sections connected to the one set and outwardly extending arcuate areas extending between the parallel and flat sections; and a conductive material applied to at least a portion of each of said two pads and thereafter reflowed onto the outwardly extending arcuate areas on each of the two pads, thereby facilitating alignment of the component with the pad arrangement.

12. The radio of claim 11, wherein said pads are sized to extend beyond the terminations of the surface mount component when the surface mount component is aligned with the pad arrangement.

13. The radio of claim 1, wherein said opposite pads are positioned on said circuit board such that the outwardly extending arcuate areas of each of the two pads are positioned substantially in front of each other.

14. The radio of claim 11, wherein the conductive material comprises solid solder deposition.

* * * * *